United States Patent
Brkic (10) Patent No.: US 10,261,754 B2
(45) Date of Patent: Apr. 16, 2019

(54) DATA PROCESSING SYSTEMS (71) Applicant: ARM Limited, Cambridge (GB)

(72) Inventor: Toni Viki Brkic, Lund (SE)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/227,164

(22) Filed: Aug. 3, 2016

(65) Prior Publication Data

US 2017/0039032 A1 Feb. 9, 2017

(30) Foreign Application Priority Data

Aug. 3, 2015 (GB) .................................. 1513712.8
Aug. 3, 2015 (GB) .................................. 1513716.9

(51) Int. Cl.
*G06F 5/01* (2006.01)
*G06F 7/483* (2006.01)
*H03M 7/24* (2006.01)

(52) U.S. Cl.
CPC .............. *G06F 5/012* (2013.01); *G06F 7/483* (2013.01); *H03M 7/24* (2013.01); *G06F 2205/00* (2013.01)

(58) Field of Classification Search
CPC ........... G06F 5/012; G06F 7/383; H03M 7/24
See application file for complete search history.

(56) References Cited

U.S. PATENT DOCUMENTS

| 5,161,117 A | 11/1992 | Waggener, Jr. | |
| 9,264,066 B2* | 2/2016 | Blomgren | H03M 7/24 |
| 2014/0280405 A1* | 9/2014 | Rose | G06F 5/01 |
| | | | 708/201 |
| 2015/0347108 A1* | 12/2015 | Munshi | G06F 8/41 |
| | | | 717/146 |

OTHER PUBLICATIONS

Brkic, "Data Processing Systems," U.S. Appl. No. 15/227,149, filed Aug. 3, 2016.
Office Action dated Jun. 20, 2018, U.S. Appl. No. 15/227,149, filed Aug. 3, 2016.
Microsoft, "Data Conversion Rules," https://msdn.microsoft.com/en-us/library/windows/desktop/dd607323, Dec. 2014, retrieved from https://web.archive.org/web/20141214015355/https://msdn.microsoft.com/en-us/library/windows/desktop/dd607323(v=vs.85).aspx.

* cited by examiner

*Primary Examiner* — Chuong D Ngo
(74) *Attorney, Agent, or Firm* — Vierra Magen Marcus LLP (57) ABSTRACT

A method of operating a data processing system when determining an unsigned normalized integer representation U of a number x is disclosed. When the number x has a value between 0 and 1, it is determined 31 whether the number x is greater than or equal to 0.5. When it is determined that the number x is greater than or equal to 0.5, the bit of the binary representation of the number x that represents the value 0.5 is inverted 32, and the unsigned normalized integer representation U of the number x is determined using the value of the binary representation of the number x having its bit that represents the value 0.5 inverted.

17 Claims, 3 Drawing Sheets

DATA PROCESSING SYSTEMS

CROSS-REFERENCE TO RELATED APPLICATIONS

This application relates to the application GB 1513712.8 entitled "Data Processing Systems" filed on 3 Aug. 2015, to the application GB 1513716.9 entitled "Data Processing Systems" filed on 3 Aug. 2015, and to the application entitled "Data Processing Systems" filed on the same day. The entire contents of these documents are incorporated herein by reference.

BACKGROUND

The technology described herein relates to data processing systems, and in particular to methods and apparatus for converting between different number representations in data processing systems.

Data processing systems, such as graphics processing systems, typically handle numbers using various different representations.

One common way in which a number can be represented in data processing systems is using the floating point representation, e.g. in accordance with the IEEE 754 Standard. The floating point representation of a number will typically include a sign, an exponent and a mantissa, and will have a certain precision such as 16-bit, 32-bit or 64-bit precision.

Another common way in which a number can be represented in data processing systems is using the unsigned normalized integer, or "unorm", representation, e.g. as defined in DirectX. In this case, a number between 0 and 1 is represented using an integer between 0 and $(2^b-1)$, where b is the number of bits, i.e. the precision, of the unorm representation. In other words, numbers in the range 0 to 1 are linearly mapped to integers in the range 0 to $(2^b-1)$, e.g. using rounding to the nearest integer.

In data processing systems, such as graphics processing systems, it is often necessary to convert between the various different number representations that are supported and used, and in particular to convert between the floating point representation of a number and the unorm representation of the number. This can arise, for example, in graphics processing systems where depth ("Z") values, colour values, etc., used in graphics processing operations can often be represented using both the floating point representation and the unorm representation.

When using rounding to the nearest integer, the value of a b-bit unorm representation U of a number x is given by the equation:

$$U=\text{floor}(x\times(2^b-1)+0.5), \quad (1)$$

where the unorm representation U is clamped according to:
$U=2^b-1$ for $x \geq 1.0$, and
$U=0$ for $x \leq 0$,
i.e. the unorm representation U is set to its maximum for numbers greater than or equal to one, and is set to its minimum for numbers less than or equal to zero.

One way in which this conversion can be achieved in hardware utilizes the fact that equation (1) can be rewritten as:

$$U=\text{floor}(x \times 2^b - x + 0.5),$$

and can therefore be translated into hardware as a shift operation, a subtraction operation, an addition operation, and then a truncation (floor) operation.

However, this combination of operations is relatively expensive in hardware, e.g. in terms of the required on-chip area and/or the amount of processing required, and therefore the power consumption.

The Applicants therefore believe that there remains scope for improved techniques for converting between the floating point representation of a number and the unorm representation of the number in data processing systems.

BRIEF DESCRIPTION OF THE DRAWINGS

Various embodiments of the technology described herein will now be described by way of example only and with reference to the accompanying drawings, in which.

Like reference numerals are used for like components throughout the drawings, where appropriate.

DETAILED DESCRIPTION

A first embodiment of the technology described herein comprises a method of operating a data processing system when determining an unsigned normalized integer representation U of a number x, the method comprising:

when the number x has a value between 0 and 1:
determining whether the number x is greater than or equal to 0.5;
wherein when it is determined that the number x is greater than or equal to 0.5, the method further comprises:
inverting the bit of the binary representation of the number x that represents the value 0.5; and
determining the unsigned normalized integer representation U of the number x using the value of the binary representation of the number x having its bit that represents the value 0.5 inverted.

A second embodiment of the technology described herein comprises apparatus for determining an unsigned normalized integer representation U of a number x that has a value between 0 and 1, comprising:

processing circuitry configured to determine whether the number x is greater than or equal to 0.5; and
processing circuitry configured to, when it is determined that the number x is greater than or equal to 0.5:
invert the bit of the binary representation of the number x that represents the value 0.5; and
determine the unsigned normalized integer representation U of the number x using the value of the binary representation of the number x having its bit that represents the value 0.5 inverted.

The technology described herein is directed to a method and apparatus for determining an unsigned normalized integer ("unorm") representation U of a number x. In the technology described herein, if the number x has a (decimal) value between 0 and 1, then it is determined whether the number x is greater than or equal to 0.5. If it is determined that the number x is greater than or equal to 0.5, then the bit of the binary representation of the number x that represents the value 0.5 is inverted, and the resulting value (i.e. the value of the binary representation of the number x having its bit that represents the value 0.5 inverted) is used to determine the unsigned normalized integer representation U of the number x.

As will be discussed further below, the Applicants have recognised that this arrangement can be used to determine an unsigned normalized integer representation of a number in a particularly efficient manner, i.e. to facilitate more efficient and effective operation of the data processing system.

In particular, the Applicants have recognised that since the unsigned normalized integer representation is defined so as to only be capable of representing (decimal) numbers between 0 and 1, then when determining the unsigned normalized integer representation U of a number x that has a value between 0 and 1, for values of the number x that are greater than or equal to 0.5, the bit of the binary representation of the number x that represents the value 0.5 will be set to 1. This then means that for values of the number x that are greater than or equal to 0.5, inverting the bit of the binary representation of the number x that represents the value 0.5 (i.e. setting that bit to 0) will have the effect of subtracting 0.5 from the number x (i.e. of determining x−0.5).

The Applicants have furthermore recognised that this is a particularly efficient and convenient manner in which to determine the value (x−0.5) e.g. without having to perform a "full" addition or subtraction operation. This is because the inversion operation can be (and in an embodiment is) implemented in hardware in a relatively straightforward and efficient manner, i.e. using a relatively small amount of processing circuitry (i.e. chip area).

The so-determined value (x−0.5) may then be (and in an embodiment is) used to determine the unsigned normalized integer representation U of the number x (as will be discussed in more detail below).

The Applicants have found that this arrangement is significantly more efficient, e.g. in terms of the required on-chip area and/or the amount of processing required, and therefore the power consumption, than the known techniques.

In particular, the technology described herein can be (and in an embodiment is) used to reduce the amount of (e.g. fixed function) processing circuitry (i.e. chip area) that is required for determining an unsigned normalized integer representation of a number and/or to make more efficient use of processing circuitry (i.e. chip area). As will be discussed in more detail below, in situations (such as in graphics processing) where this determination is performed frequently, the technology described herein can result in a significant saving in chip area and/or power consumption. This accordingly reduces the power consumption of the overall data processing system and/or allows the data processing system to perform more processing operations without increasing its power consumption.

The technology described herein can accordingly reduce the processing and power requirements of data processing systems where it is necessary to determine an unsigned normalized integer representation of a number, such as in data processing systems that support and use the unorm number representation format together with one or more other formats such as a floating point number representation format.

The technology described herein therefore results in the data processing system operating in a more efficient and effective manner. The number x that is considered in the technology described herein may be any suitable number for which it is desired to determine an unsigned normalized integer representation.

The number x may be used to represent any kind of data in the data processing system. However, in an embodiment, the data processing system comprises a graphics processing system, and the number x is used to represent data in the graphics processing system, such as depth or values, or colour (e.g. RGB or RGBα) values, etc.

The number x may be (initially) defined and represented in the data processing system in any desired and suitable manner. However, in an embodiment, the number x is (initially) represented using a floating point representation. Accordingly, in an embodiment the method and apparatus are for converting from a floating point representation of a number x to an unsigned normalized integer representation U of the number x.

Thus, in an embodiment the method comprises a method of operating a data processing system when converting from a floating point representation of a number x to an unsigned normalized integer representation U of the number x. In an embodiment, the apparatus is for converting from a floating point representation of a number x to an unsigned normalized integer representation U of the number x.

The floating point representation of the number x in an embodiment includes at least an exponent and a mantissa, optionally together with a sign. Each of the exponent and the mantissa are in an embodiment respectively represented by a binary number which in an embodiment comprises plural bits, while the optional sign is in an embodiment represented by a single bit (i.e. a sign bit). Other arrangements would, of course, be possible.

The floating point representation of the number x may have any suitable and desired precision (number of bits), such as for example 16-bit (half), 32-bit (single), 64-bit (double), or 128-bit (quad) precision.

The floating point representation of the number x is in an embodiment a normalised floating point representation of the number x. Where the number representation of the number x is not normalised, it is in an embodiment normalised before being processed.

In an embodiment, the floating point representation of the number x is in accordance with the IEEE 754 Standard.

The unsigned normalized integer representation U of the number that is determined in the technology described herein should be (and in an embodiment is) an integer that represents the number x. The integer should have (and in an embodiment does have) a (decimal) value between 0 and $(2^b-1)$ (inclusive), where b is the number of bits, i.e. the precision, of the unsigned normalized integer representation.

In an embodiment, values of the number x in the range 0 to 1 are linearly mapped to unorm integers in the range 0 to $(2^b-1)$, in an embodiment using rounding to the nearest integer, and in an embodiment rounding half integers up. Thus, the determination of the unsigned normalized integer representation U of the number x according to the technology described herein is in an embodiment done according to equation (1) above (or any equivalents thereof).

It would also be possible to implement and use other desired and suitable schemes and/or rounding schemes. For example, it would be possible to round half integers down, to round half integers to the nearest even integer, or to round half integers to the nearest odd integer, etc.

Where half integers are rounded down, the determination of the unsigned normalized integer representation U of the number x may be done according to the equation (or any equivalents thereof):

$$U=\text{floor}(x \times (2^b-1)+0.49999\ldots).$$

Where half integers are rounded to the nearest even or odd integer, the rounding may use the integer part I of $(x \times 2^b)$ to determine whether a half integer should be rounded up or down.

The unsigned normalized integer representation U of the number may have any suitable and desired precision b, such as for example 1-bit, 2-bit, 4-bit, 8-bit, 10-bit, 12-bit, 16-bit, 24-bit or 32-bit precision.

As discussed above, the methods of the technology described herein are performed when the number x has a value between 0 and 1. This is because the unsigned normalized integer representation is defined so as to only be capable of representing numbers between 0 and 1.

Values of the number x that fall outside of this range may be treated in any suitable and desired manner. For example, such values may be simply ignored, i.e. not processed, such that no unsigned normalized integer representation U is determined for such numbers. Alternatively, such values may be processed in the manner of the technology described herein, but then the result of that processing may be ignored (since such results will not be valid).

In an embodiment, where the number x has a value outside of the range 0 to 1, then an unsigned normalized integer representation of the number is in an embodiment determined, in an embodiment using clamping.

According to one such embodiment, the unsigned normalized integer representation U is subjected to clamping according to:

$U = 2^b - 1$ for $x > 1.0$, and
$U = 0$ for $x < 0$.

That is, for values of the number x greater than 1, the unsigned normalized integer representation U is in an embodiment clamped to (set to) its maximum value, i.e. $(2^b - 1)$, and for values of the number x less than 0, the unsigned normalized integer representation U is in an embodiment clamped to (set to) its minimum value, i.e. 0.

In an embodiment, the unsigned normalized integer representation U is subjected to clamping according to:

$U = 2^b - 1$ for $x \geq 1.0$, and
$U = 0$ for $x \leq 0$, as this can then reduce the amount of processing (and therefore the power consumption of the overall data processing system) required for the conversion (as will be described further below) since it may not then be necessary to perform the determination of the unsigned normalized integer representation of the technology described herein when the number x is equal to 1 or 0.

Other arrangements would, of course, be possible. For example, it would be possible to implement and use a mixture or combination of these two clamping schemes.

Thus, in an embodiment, the method of the technology described herein comprises: when the number x has a value that is greater than or equal to (or greater than) 1, clamping (and the data processing system is configured to clamp) the unsigned normalized integer representation U of the number x to a (first) selected, in an embodiment predefined, value, in an embodiment as described above; and when the number x has a value that is less than or equal to (or less than) 0, clamping (and the data processing system is configured to clamp) the unsigned normalized integer representation U of the number x to a (second) selected, in an embodiment predefined, value, in an embodiment as described above.

It will accordingly be appreciated that the method of the technology described herein in an embodiment further comprises a step of determining (and the data processing system is in an embodiment configured to determine) whether the number x is greater than or equal to (or greater than) 1 and/or determining whether the number x is less than or equal to (or less than) 0.

In an embodiment, when (if) it is determined that the number x is greater than or equal to (or greater than) 1, then the unsigned normalized integer representation U is in an embodiment clamped to (set to) its maximum value, i.e. in an embodiment to $(2^b - 1)$. Correspondingly, when (if) it is determined that the number x is less than or equal to (or less than) 0, then the unsigned normalized integer representation U is in an embodiment clamped to (set to) its minimum value, i.e. in an embodiment to 0.

Where (if) the unsigned normalized integer number U is clamped, then the unsigned normalized integer determination of the technology described herein can be (and in an embodiment is) omitted, since the clamping operation will in effect return the appropriate value for the unsigned normalized integer representation U. This can accordingly further reduce the amount of processing and the power use of the system.

On the other hand, when (if) it is determined that the number x is less than (or less than or equal to) 1 and is greater than (or greater than or equal to) 0, then the unsigned normalized integer representation U is in an embodiment determined in the manner described above.

Whether the number x is greater than or equal to (or greater than) 1 and/or whether the number x is less than or equal to (or less than) 0 can be determined in any suitable and desired manner.

In an embodiment, whether the number x is greater than or equal to (or greater than) 1 is determined by considering the exponent of the floating point representation of the number. The Applicants have recognised that this is a particularly simple and efficient way in which to make this determination, i.e. that may be implemented using a relatively small amount of (e.g. fixed function) processing circuitry (i.e. chip area) and/or using processing circuitry in a more efficient manner.

In these embodiments, where (if) the exponent is larger than or equal to zero, then it is in an embodiment determined that the number x is greater than or equal to 1. Correspondingly, where (if) the exponent is less than zero, then it is in an embodiment determined that the number x is less than 1. (In these embodiments, where the exponent of the floating point representation of the number x is stored using an exponent bias (as is the case, e.g., in the IEEE 754 Standard), then the exponent to be used is in an embodiment determined from the stored exponent value by appropriately applying the exponent bias.)

Equally, in an embodiment, whether the floating point number x is less than or equal to (or less than) 0 may be determined by considering the sign bit (where present) of the floating point number x. Again, the Applicants have recognised that this is a particularly simple and efficient way in which to make this determination, i.e. that may be implemented using a relatively small amount of (e.g. fixed function) processing circuitry (i.e. chip area) and/or using processing circuitry in a more efficient manner.

In these embodiments, where (if) the sign bit indicates that the number x is negative, then it is in an embodiment determined that number x is less than zero. Correspondingly, where (if) the sign bit indicates that the number x is positive, then it is in an embodiment determined that the number x is greater than or equal to zero.

Other techniques for making these determinations would, of course, be possible.

As discussed above, in the technology described herein, it is determined whether the number x is greater than or equal to 0.5. This may be determined any suitable and desired manner. For example, the number x could simply be compared with 0.5.

However, in an embodiment, this determination is made by considering (using) the exponent of the floating point representation of the number x. The Applicants have found that this is a particularly simple and efficient way in which to make this determination, i.e. that may be implemented using a relatively small amount of (e.g. fixed function) processing circuitry (i.e. chip area) and/or using processing circuitry in a more efficient manner.

As will be appreciated by those having skill in the art, for values of the number x between 0 and 1, the number x will be greater than or equal to 0.5 (and less than 1) where the exponent of the floating point representation of the number x is equal to −1, since in this case the most significant bit of the mantissa of the binary representation of the number x will represent the value 0.5 (i.e. the value $2^{-1}$).

Thus, in these embodiments, determining whether the number x is greater than or equal to 0.5 in an embodiment comprises determining whether the exponent of the floating point representation of the number x is equal to −1. Where (if) the exponent is equal to −1, then it is in an embodiment determined that the number x is greater than or equal to 0.5. Correspondingly, where (if) the exponent is other than −1 (e.g. less than −1), then it is in an embodiment determined that the number x is less than 0.5.

In these embodiments (and other embodiments described herein), where the exponent of the floating point representation of the number x is stored using an exponent bias (as is the case, e.g., in the IEEE 754 Standard), then the exponent to be considered and used (e.g. in the manner described above) is in an embodiment determined from the stored exponent value by appropriately applying the exponent bias (e.g. by appropriately applying the exponent bias to the stored exponent before the biased exponent is then considered and used in the determination e.g. as described above).

As discussed above, when (if) it is determined that the number x is greater than or equal to 0.5, then the bit of the binary representation of the number x that represents the value 0.5 is inverted.

That is, in an embodiment, the bit of the binary representation of the number x that represents the value $2^{-1}$, is inverted (flipped), e.g. so as to subtract 0.5 from the number x (i.e. to determine the binary representation of (x−0.5)). As will be appreciated by those having skill in the art, where the number x is (initially) defined using the floating point representation, this bit will be (and in an embodiment is) the most significant bit of the binary representation of the mantissa of the floating point representation of the number x (for values of the number x greater than or equal to 0.5 and less than 1). As discussed above, this bit will be set to 1, and so this step effectively (and in an embodiment) comprises setting the bit of the binary representation of the number x that represents the value 0.5 to zero, i.e. clearing the bit of the binary representation of the number x that represents the value 0.5. Thus, in an embodiment, inverting the bit of the binary representation of the number x that represents the value 0.5 comprises clearing the bit of the binary representation of the number x that represents the value 0.5.

In these embodiments (and other embodiments described herein), where the mantissa of the floating point representation of the number x is handled or stored without the implicit bit (as is the case, e.g., in the IEEE 754 Standard), then the implicit bit is in an embodiment prepended to the mantissa before it is used, as appropriate.

The inversion operation may be performed ("directly") on the binary representation of the mantissa of the floating point representation of the number x (in an embodiment with the implicit bit prepended and in an embodiment with the exponent applied), e.g. so as to determine the "true" binary representation of (x−0.5). Alternatively, the inversion operation may be performed on a shifted version of the binary representation of the mantissa of the floating point representation of the number x (i.e. so as to determine a shifted version of the binary representation of (x−0.5)). In one such embodiment, the inversion operation may be performed on the binary representation of the mantissa of the floating point representation of the number x with b appended zeros (i.e. a version of the binary representation of the mantissa of the floating point representation of the number x that has had a number of bits corresponding to the number of bits b (the precision of the unorm representation being used) appended to it).

In these embodiments (and other embodiments described herein), a sign bit may be prepended to the mantissa of the floating point representation of the number x, in an embodiment indicative of a positive number (e.g. set to zero), before it is used, as appropriate, e.g. to ensure that operations involving this value are performed correctly (as will described further below).

As discussed above, in the technology described herein, once the bit of the binary representation of the number x that represents the value 0.5 has been inverted (cleared), the unsigned normalized integer representation U of the number x is then determined using the value of the binary representation of the number x having its bit that represents the value 0.5 inverted (cleared).

The unsigned normalized integer representation U of the number x may be determined in any suitable and desired manner. However, in an embodiment, the value of the binary representation of the number x having its bit that represents the value 0.5 inverted (cleared) is used to determine the unsigned normalized integer representation U of the number x in accordance with equation (1) above (or any equivalents thereof).

As discussed above, the value of the binary representation of the number x having its bit that represents the value 0.5 inverted (cleared) that is used to determine the unsigned normalized integer representation U of the number x in an embodiment corresponds to (x−0.5) (or a shifted version of (x−0.5)). Accordingly, these embodiments rely on the fact that equation (1) can be rewritten as:

$$U=\text{floor}(x \times 2^b - (x-0.5)). \tag{2}$$

In an embodiment, the unsigned normalized integer representation U of the number x is determined by evaluating this equation using the binary representation of the number x having its bit that represents the value 0.5 inverted (cleared) (i.e. using the (shifted version of the) value (x−0.5)), e.g. by subtracting that value from (a shifted version of) the binary representation of the value $(x \times 2^b)$, optionally appropriately shifting the resulting quantity, and then determining the integer part of (i.e. the largest integer not greater than) the resulting quantity. This may be done in any suitable and desired manner.

In an embodiment, the binary representation of the value $(x \times 2^b)$ or a shifted version of the binary representation of the value $(x \times 2^b)$ is (firstly) determined. This may be determined in any suitable and desired manner. However, in an embodiment, the (shifted version of the) binary representation of the value ($x \times 2^b$) is determined by appending b zeros to the binary representation of the mantissa of the floating point representation of the number x. Where the physical width is sufficient, the binary representation of the value ($x \times 2^b$) may be determined by shifting the binary representation of the mantissa of the floating point representation of the number x by an appropriate number of bits corresponding to the number of bits b (the precision of the unorm representation being used).

Thus, in an embodiment, b zeros are appended to the binary representation of the mantissa of the floating point representation of the number x, or the binary representation of the mantissa of the floating point representation of the number x is shifted by an appropriate number of bits corresponding to the number of bits b (the precision of the unorm representation being used).

In an embodiment, the value of the binary representation of the number x having its bit that represents the value 0.5 inverted (cleared) (i.e. the (shifted version of the) binary representation of the value (x−0.5)) is subtracted from the binary representation of the mantissa of the floating point representation of the number x with b appended zeros (i.e. the (shifted version of the) binary representation of the value ($x \times 2^b$)). That is, (a shifted version of) the binary representation of the quantity (($x \times 2^b$)−(x−0.5)) is in an embodiment determined. This may be done in any suitable and desired manner.

In an embodiment, the negative of the (shifted version of the) binary representation of the number x having its bit that represents the value 0.5 inverted (cleared) (i.e. the negative of the (shifted version of the) binary representation of (x−0.5), that is, (a shifted version of) the binary representation of (0.5−x)) is determined. This may be determined in any suitable and desired manner, but in an embodiment this is done by determining the two's complement of the (shifted version of the) binary representation of the number x having its bit that represents the value 0.5 inverted (cleared).

The so-determined value (e.g. the negative (two's complement) of the (shifted version of the) binary representation of the number x having its bit that represents the value 0.5 inverted (cleared)) is in an embodiment then added to the binary representation of the mantissa of the floating point representation of the number x with b appended zeros (i.e. the (shifted version of the) binary representation of the value (0.5−x) is in an embodiment added to the (shifted version of the) binary representation of the value ($x \times 2^b$)). The Applicants have found that this represents a particularly convenient and efficient manner in which to determine (a shifted version of) the quantity (($x \times 2^b$)−(x−0.5)), i.e. that may be implemented using a relatively small amount of (e.g. fixed function) processing circuitry (i.e. chip area) and/or using processing circuitry in a more efficient manner.

The (shifted version of the) quantity (($x \times 2^b$)−(x−0.5)) is in an embodiment then truncated (rounded), and in an embodiment shifted (where necessary), e.g. and in an embodiment so as to determine the largest integer not greater than (($x \times 2^b$)−(x−0.5)) (i.e. to determine floor(($x \times 2^b$)−(x−0.5))). This may be done in any suitable and desired manner. However in an embodiment, this is done by shifting the (shifted version of the) binary representation of the quantity (($x \times 2^b$)−(x−0.5)) by a number of bits corresponding to the number of bits (the precision) M of the mantissa of the floating point representation of the number x plus a bias, e.g. and in an embodiment to the right, where the bias in an embodiment corresponds to the exponent of the floating point representation of the number x plus 1 (accordingly, where the exponent bias is 127, the bias may be determined from the stored exponent by subtracting the exponent from 126). As will be appreciated by those having skill in the art, this will have the effect of stripping the (shifted version of the) quantity (($x \times 2^b$)−(x−0.5)) of the sign bit and above, so as to determine floor(($x \times 2^b$)−(x−0.5)) appropriately.

As discussed above, in the technology described herein it is determined whether the number x is greater than or equal to 0.5, and when this is the case the unsigned normalized integer representation U of the number x is determined in accordance with the technology described herein.

In an embodiment, where (if) it is determined that the number x is other than (not) greater than or equal to 0.5 (i.e. less than 0.5) (e.g. since the exponent of the floating point representation of the number x is other than (not) equal to −1), then the value of the unsigned normalized integer representation U of the number x is also determined. In these embodiments, the value of the unsigned normalized integer representation U of the number x may be determined in any suitable and desired manner, e.g. and in an embodiment in accordance with equation (1) above (or any equivalents thereof).

In an embodiment, for values of the number x that are less than 0.5, the unsigned normalized integer representation U of the number x is determined in a manner that corresponds closely to that described above (e.g. for values of the number x that are greater than or equal to 0.5). As will be described in more detail below, this then means that the process for determining the unsigned normalized integer representation U of the number x can be (and in an embodiment is) implemented using at least some shared processing circuitry (using the same logic) for any and all values of the number x that fall between 0 and 1. This represents a particularly convenient and efficient manner in which the unsigned normalized integer representation U of a number x that falls between 0 and 1 can be determined, i.e. that may be implemented using a relatively small amount of (e.g. fixed function) processing circuitry (i.e. chip area) and/or using processing circuitry in a more efficient manner.

Thus, in an embodiment, the unsigned normalized integer representation U of the number x is determined by evaluating equation (2) above, e.g. (effectively) using (a shifted version of) the binary representation of the value (x−0.5), e.g. and in an embodiment in a corresponding manner to that discussed above.

However, it should be noted that in these embodiments the value of the binary representation of the number x having its bit that represents the value 0.5 inverted will not correspond to (x−0.5) and so would not be appropriate for use in determining the unsigned normalized integer representation U of the number x. Accordingly, this value is in an embodiment not determined or used in these embodiments.

In one embodiment, the (binary representation of the) value of (x−0.5) may be "directly" determined, e.g. using the mantissa of the floating point representation of the number together with the exponent of the floating point representation of the number x (e.g. using the mantissa of the floating point representation of the number x with the exponent appropriately applied, that is, the mantissa shifted by an appropriate number of bits corresponding to the exponent), and subtracting (the binary representation of) 0.5 from this value.

Thus, according to this embodiment, (the binary representation of) 0.5 is subtracted from the (the binary representation of the) mantissa of the floating point representation of the number x with the exponent appropriately applied. The so-determined (binary representation of the) value of (x−0.5) may then be (and in an embodiment is) used to determine the unsigned normalized integer representation U of the number x.

However, in an embodiment, the exponent of the floating point representation of the number x may be (and in an embodiment is) applied at a later point in the unsigned normalized integer representation determination process. The Applicants have found that this can result in a more convenient and efficient pipelined process for all values of the number x between 0 and 1, and can further reduce the amount of processing and/or chip area required, e.g. since the number of times that the exponent need be applied can be reduced (e.g. and in an embodiment to a single time).

Thus, in an embodiment, a shifted version of the binary representation of the value (x−0.5) is determined, in an embodiment using a shifted version of the binary representation of the number x and a shifted version of the binary representation of 0.5, e.g. and in an embodiment by subtracting the shifted version of the binary representation of 0.5 from the shifted version of the binary representation of the number x. The shifted version of the binary representation of the value (x−0.5) is in an embodiment then used to determine the unsigned normalized integer representation U of the number x.

In an embodiment, the shifted version of the binary representation of the number x corresponds to (is) the mantissa of the floating point representation of the number x (in an embodiment with a prepended sign bit having an appropriate value indicative of a positive value (e.g. set to zero)), in an embodiment without the exponent applied. The shifted version of the binary representation of 0.5 in an embodiment corresponds to a version of the binary representation of 0.5 that is shifted by an appropriate number of bits such that applying the exponent to the binary number resulting from the subtraction of the shifted version of the binary representation of 0.5 from the shifted version of the binary representation of the number x would result in the ("true" or non-shifted) binary representation of the value (x−0.5).

In an embodiment, the (shifted version of the) binary representation of the value (x−0.5) is determined using (by determining) the (shifted version of the) binary representation of the negative of 0.5, e.g. by merging this with the (shifted version of the) binary representation of the number x, e.g. and in an embodiment by performing an OR operation between the (shifted version of the) binary representation of the number x and the (shifted version of the) binary representation of the negative of 0.5. The Applicants have recognised that it is possible to use an OR (merge) operation here because where the number x is less than 0.5 (where x<0.5), the binary representations of the (shifted versions of the) number x and the value −0.5 will not both have bits set to one at the same location (bit position). This then provides a particularly efficient and convenient manner in which to determine the value (x−0.5) where x<0.5, e.g. without having to perform a "full" addition or subtraction operation, i.e. that may be implemented using a relatively small amount of (e.g. fixed function) processing circuitry (i.e. chip area) and/or using processing circuitry in a more efficient manner.

In an embodiment, the (shifted version of the) binary representation of the negative of 0.5 comprises (is determined by determining) the two's complement of the (shifted version of the) binary representation of 0.5 (and in an embodiment the two's complement of the (shifted version of the) binary representation of 0.5 is merged with the (shifted version of the) binary representation of the number x), e.g. and in an embodiment by performing an "or" operation between the (shifted version of the) binary representation of the number x and the (shifted version of the) binary representation of the negative (two's complement) of 0.5.

The (shifted version of the) binary representation of the negative of 0.5 may be determined, e.g. by performing a two's complement operation on (a shifted version of) the binary representation of 0.5. However, in an embodiment, the (shifted version of the) binary representation of the negative of 0.5 may be determined by shifting a predetermined binary number. This represents a particularly simple and efficient manner in which the (shifted version of the) binary representation of the negative of 0.5 may be determined, i.e. that may be implemented using a relatively small amount of (e.g. fixed function) processing circuitry (i.e. chip area) and/or using processing circuitry in a more efficient manner.

In an embodiment, the predetermined binary number comprises a sequence of bits which are all set to 1. In an embodiment, the predetermined binary number has a length corresponding to the number of bits (the precision) M of the mantissa of the floating point representation of the number, plus the precision of the unorm number b, plus 1 (i.e. M+b+1) (i.e. the predetermined number in an embodiment comprises M+b+1 bits set to 1). As will be appreciated by those having skill in the art, this will then mean that when the predetermined binary number is shifted, it will have an appropriate value and number of bits for the process of determining the unsigned normalized integer representation U of the number x.

According to these embodiments, the (shifted version of the) binary representation of the negative of 0.5 is in an embodiment determined by shifting the predetermined binary number by a number of bits corresponding to the bias (where the bias in an embodiment corresponds to the exponent of the floating point representation of the number x plus 1) plus the number of bits (the precision) M of the mantissa of the floating point representation of the number minus 1, and in an embodiment to the left. As will be appreciated by those having skill in the art, the so-shifted value will correspond to a version of the binary representation of 0.5 that is shifted by an appropriate number of bits such that applying the exponent to the binary number resulting from the subtraction of this shifted version of the binary representation of 0.5 from the shifted version of the binary representation of the number x would result in the ("true" or non-shifted) binary representation of the value (x−0.5).

Thus, in an embodiment, a predetermined binary number, that in an embodiment comprises a sequence of M+b+1 bits which are all set to 1, is shifted to the left by a number of a bits corresponding to the bias plus the number of bits (the precision) M of the mantissa of the floating point representation of the number minus 1. This shifted predetermined binary number is in an embodiment then merged with the (shifted version of the) binary representation of the number x, e.g. and in an embodiment by performing an "or" operation between the (shifted version of the) binary representation of the number x and the (shifted version of the) binary representation of the negative (two's complement) of 0.5, e.g. so as to determine the (shifted version of the) binary representation of the value (x−0.5).

Other arrangements would, of course, be possible. For example, instead of shifting the predetermined binary number, it would be possible to append an appropriate number of zeros to the predetermined binary number.

As discussed above, the unsigned normalized integer representation U of the number x is in an embodiment determined by evaluating equation (2) above, using the binary representation of the value of (x−0.5) or the shifted version of the binary representation of the value of (x−0.5), e.g. by (effectively) subtracting that value from (a shifted version of) the binary representation of the value (x×2$^b$), and then determining the integer part of (i.e. the largest integer not greater than) the resulting quantity, e.g. and in an embodiment in a manner corresponding to that described above.

Thus, in an embodiment the (shifted version of the) binary representation of the value (x×2$^b$) is in an embodiment determined, in an embodiment by appending b zeros to the (shifted version of the) binary representation of the mantissa of the floating point representation of the number x or by shifting the (shifted version of the) binary representation of the mantissa of the floating point representation of the number x by an appropriate number of bits corresponding to the number of bits b (the precision of the unorm representation being used). The (shifted version of the) binary representation of the value (x−0.5) is subtracted from the (shifted version of the) binary representation of the value (x×2$^b$), e.g. so as to determine the (shifted version of the) binary representation of the quantity ((x×2$^b$)−(x−0.5)). This is in an embodiment done by determining the negative (two's complement) of the (shifted version of the) binary representation of (x−0.5) (i.e. the (shifted version of the) binary representation of the value (0.5−x)), and adding this value to the (shifted version of the) binary representation of the value (x×2$^b$). The (shifted version of the) binary representation of the quantity ((x×2$^b$)−(x−0.5)) is in an embodiment then truncated (rounded), e.g. and in an embodiment so as to determine (a shifted version of) the largest integer not greater than ((x×2$^b$)−(x−0.5)) (i.e. to determine (a shifted version of) floor((x×2$^b$)−(x−0.5))).

In embodiments where a shifted version of floor((x×2$^b$)−(x−0.5)) is determined, then the exponent of the floating point representation of the number x is in an embodiment applied to the shifted version of floor((x×2$^b$)−(x−0.5)) e.g. to determine the largest integer not greater than ((x×2$^b$)−(x−0.5)) (i.e. to determine floor((x×2$^b$)−(x−0.5))). This may be done as a separate standalone operation, but in an embodiment is done together with the truncation operation described above. Thus, in an embodiment, the shifted version of floor((x×2$^b$)−(x−0.5)) is shifted by a number of bits corresponding to the number of bits (the precision) M of the mantissa of the floating point representation of the number x plus the bias, e.g. and in an embodiment to the right.

The Applicants have found that this represents a particularly efficient and convenient way to determine the quantity floor(x×2$^b$−(x−0.5)), and therefore to determine the unsigned normalized integer representation U of the number x, i.e. that may be implemented using a relatively small amount of (e.g. fixed function) processing circuitry (i.e. chip area) and/or using processing circuitry in a more efficient manner.

As discussed above, in an embodiment, the unsigned normalized integer representation U of a number x that is less than 0.5 is determined using (a shifted version of) the binary representation of the value (x−0.5) which is determined by merging (a shifted version of) the binary representation of the negative of 0.5 with (a shifted version of) the binary representation of the number x, e.g. and in an embodiment by performing an OR operation between the (shifted version of the) binary representation of the number x and the (shifted version of the) binary representation of the negative (two's complement) of 0.5. The Applicants believe that this method is new and advantageous in its own right.

Thus, a third embodiment of the technology described herein comprises a method of operating a data processing system when determining an unsigned normalized integer representation U of a number x, the method comprising:
when the number x has a value between 0 and 1:
determining whether the number x is less than 0.5;
wherein when it is determined that the number x is less than 0.5, the method further comprises:
determining a binary representation of the value (x−0.5) by merging a binary representation of the negative of 0.5 with a binary representation of the number x; and
determining the unsigned normalized integer representation U of the number x using the binary representation of the value (x−0.5).

A fourth embodiment of the technology described herein comprises apparatus for determining an unsigned normalized integer representation U of a number x that has a value between 0 and 1, comprising:
processing circuitry configured to determine whether the number x is less than 0.5; and
processing circuitry configured to, when it is determined that the number x is less than 0.5:
determine a binary representation of the value (x−0.5) by merging a binary representation of the negative of 0.5 with a binary representation of the number x; and determine the unsigned normalized integer representation U of the number x using the binary representation of the value (x−0.5).

As will be appreciated by those skilled in the art, these embodiments of the technology described herein can, and in an embodiment do, include any one or more or all of the optional features of the technology described herein, as appropriate.

Thus, for example, whether or not the number x is less than 0.5 is in an embodiment determined by determining whether or not the number is greater than or equal to 0.5, e.g. by considering the exponent of the floating point representation of the number x, e.g. and in an embodiment as described above.

The binary representation of the value (x−0.5) may be a "true" representation of the value (x−0.5), or a shifted version of the binary representation of the value (x−0.5). Equally, the binary representation of the negative of 0.5 may be a "true" representation of the negative of 0.5, or a shifted version of the binary representation of the negative of 0.5, and the binary representation of the number x may be a "true" representation of the number x, or a shifted version of the binary representation of the number x.

Thus, in an embodiment, the method comprises (and the processing circuitry is configured to determine):
determining a shifted version of the binary representation of the value (x−0.5) by merging a shifted version of the binary representation of the negative of 0.5 with a shifted version of the binary representation of the number x; and
determining the unsigned normalized integer representation U of the number x using the shifted version of the binary representation of the value (x−0.5).

Merging the (shifted version of the) binary representation of the negative of 0.5 with the (shifted version of the) binary representation of the number x in an embodiment comprises performing an OR operation between the (shifted version of the) binary representation of the negative of 0.5 and the (shifted version of the) binary representation of the number x, e.g. and in an embodiment as described above.

The unsigned normalized integer representation U of the number x is in an embodiment determined by adding the two's complement of the (shifted version of the) binary representation of the value (x−0.5) to (a shifted version of)

the binary representation of the value ($x \times 2^b$), and then truncating (rounding) the resulting quantity and applying the exponent of the floating point representation of the number x, e.g. and in an embodiment as described above.

It will be appreciated from the above that in an embodiment of the technology described herein, the unsigned normalized integer representation U of a number is determined using one or more shift operations, one or more addition operations, and one or more two's complement operations. It is believed that this arrangement is new and advantageous in its own right.

Thus, another embodiment of the technology described herein comprises a method of determining an unsigned normalized integer representation U of a number x, the method comprising:

using one or more shift operations, one or more addition operations, and one or more two's complement operations to determine an unsigned normalized integer representation U of the number x.

Another embodiment of the technology described herein comprises apparatus for determining an unsigned normalized integer representation U of a number x, comprising:

processing circuitry operable to perform a shift operation;
processing circuitry operable to perform an addition operation; and
processing circuitry operable to perform a two's complement operation;
wherein the processing circuitry is configured to determine an unsigned normalized integer representation U of the number x.

As will be appreciated by those skilled in the art, these embodiments of the technology described herein can, and in an embodiment do, include any one or more or all of the optional features of the technology described herein, as appropriate.

Thus, for example, where x<0.5, one or more OR operations (and processing circuitry operable to perform an OR operation) are in an embodiment used to determine the (shifted version of the) binary representation of (x−0.5), e.g. and in an embodiment by merging (a shifted version of) the binary representation of the number x with the negative (two's complement) of (a shifted version of) the binary representation of 0.5.

The one or more two's complement operations (and the two's complement processing circuitry) are in an embodiment used to determine the negative (two's complement) of the (shifted version of the) binary representation of (x−0.5), e.g. and in an embodiment as described above.

The one or more addition operations (and the addition processing circuitry) are in an embodiment used to determine the (shifted version of the) binary representation of the quantity (($x \times 2^b$)−(x−0.5)), e.g. and in an embodiment by adding (a shifted version of) the binary representation of the value ($x \times 2^b$) to the negative (two's complement) of the (shifted version of the) binary representation of (x−0.5), e.g. and in an embodiment as described above.

The one or more shift operations (and the shift processing circuitry) are in an embodiment used to determine the largest integer not greater than (($x \times 2^b$)−(x−0.5)) (i.e. to determine floor(($x \times 2^b$)−(x−0.5)), e.g. and in an embodiment by shifting the (shifted version of the) binary representation of the quantity (($x \times 2^b$)−(x−0.5)) by a number of bits corresponding to the bias plus the number of bits (the precision) M of the mantissa of the floating point representation of the number x, e.g. and in an embodiment as described above.

The Applicants have found that this arrangement represents a particularly efficient method for determining an unsigned normalized integer representation of a number, e.g. in terms of the required on-chip area and/or the amount of processing required, and therefore the power consumption. This is because the combination of (shift, addition and two's complement) operations can be (and in an embodiment is) implemented in hardware using a relatively small amount of (e.g. fixed function) processing circuitry (i.e. chip area). These embodiments therefore result in the overall data processing system operating in a more efficient and effective manner.

Once it has been determined, the unsigned normalized integer representation U of the number x may be used as desired. Correspondingly, the technology described herein can be implemented in any arrangement or situation in which it is required to determine a unorm representation of a number.

For example, the technology described herein can be implemented in the situation where depth values are processed (internally) (e.g. by a graphics processor) using the floating point representation, but are stored (e.g. in a depth buffer) using the unorm representation. Equally, the technology described herein can be implemented in the situation where colour values (e.g. RGB or RGBα components) are processed (internally) (e.g. by a graphics processor) using the floating point representation, but are stored (e.g. in a tile or frame buffer) using the unorm representation.

In these situations, when it is desired to write a depth or colour value to a depth/tile buffer or to memory, the floating point representation of the depth or colour value is in an embodiment converted to a unorm representation of the depth or colour value, e.g. in accordance with the technology described herein. The determined unsigned normalized integer representation U of the depth or colour value is in an embodiment then stored.

Equally, in these situations, where it is desired to compare a (e.g. newly generated) floating point depth or colour value with a stored (unorm) depth or colour value, the floating point representation of the (new) depth or colour value is in an embodiment converted into a unorm representation of the depth or colour value, and then compared with the stored depth or colour value, as appropriate.

Thus, in an embodiment the method comprises a method of operating a data processing system when converting from a floating point representation of a depth or colour value to an unsigned normalized integer representation U of the depth or colour value. In an embodiment, the apparatus is for converting from a floating point representation of a depth or colour value to an unsigned normalized integer representation U of the depth or colour value.

In an embodiment, the data processing system (in an embodiment a graphics processing system) generates and/or processes a (respective) floating point representation of one or more (e.g. colour and/or depth) values in respect of a render output (e.g. an image, frame or tile to be displayed, a texture, etc.), for each of one or more, and in an embodiment for each of the one or more values, converts the floating point representation of the value to an unsigned normalized integer representation U of the (respective) (depth or colour) value (in accordance with the technology described herein), and stores the unsigned normalized integer representation U of the (depth or colour) value.

In another embodiment, the data processing system (in an embodiment a graphics processing system) generates and/or processes a (respective) floating point representation of one or more (e.g. colour and/or depth) values in respect of a render output (e.g. an image, frame or tile to be displayed, a texture, etc.), for each of one or more, and in an embodiment for each of the one or more values, converts the floating point representation of the value to an unsigned normalized integer representation U of the (depth or colour) value (in accordance with the technology described herein), and compares the unsigned normalized integer representation U of the (depth or colour) value with one or more stored unsigned normalized integer (depth or colour) values. One or more or each of the one or more (depth or colour) values may then be further processed (in an embodiment for display), e.g. by the data processing system (e.g. graphics processing system), and/or stored or otherwise, e.g. depending on the result of the comparison.

In these embodiments, the one or more stored values may be further processed (in an embodiment for display), e.g. by the data processing system (e.g. graphics processing system), and/or provided to a display for display.

Thus, in an embodiment, the unsigned normalized integer representation U of the number x may be further processed, e.g. for display. In an embodiment, the unsigned normalized integer representation U of the number x may be used to provide an image for display, e.g. may be provided to a display for display.

In an embodiment, the method comprises a method of operating a graphics processing system, and the number x comprises a data (colour or depth) value for use in a graphics processing operation. In an embodiment, the method comprises: when generating a render output in a graphics processing system, processing one or more data values using a (respective) floating point representation to generate one or more floating point output data values, for each of one or more, and in an embodiment for each of the one or more output data values, converting the floating point representation of the output data value to an unsigned normalized integer representation U of the output data value in the manner of the technology described herein, and storing the unsigned normalized integer representation U of the output data value.

Correspondingly, in an embodiment, the apparatus comprises a graphics processing system, and the number x comprises a data (colour or depth) value for use in a graphics processing operation by the graphics processing system. In an embodiment, the graphics processing system is configured to: when generating a render output, process one or more data values using a (respective) floating point representation to generate one or more floating point output data values, for each of one or more, and in an embodiment for each, of the one or more output data values, convert the floating point representation of the output data value to an unsigned normalized integer representation U of the output data value in the manner of the technology described herein, and store the unsigned normalized integer representation U of the output data value.

In another embodiment, the method comprises a method of operating a graphics processing system, and the number x comprises a data (colour or depth) value for use in a graphics processing operation. In an embodiment, the method comprises: when generating a render output in a graphics processing system, processing one or more data values using a (respective) floating point representation to generate one or more floating point output data values, for each of one or more, and in an embodiment for each of the one or more output data values, converting the floating point representation of the output data value to an unsigned normalized integer representation U of the output data value in the manner of the technology described herein, and comparing the unsigned normalized integer representation U of the output data value with one or more stored unsigned normalized integer data values.

Correspondingly, in an embodiment, the apparatus comprises a graphics processing system, and the number x comprises a data (colour or depth) value for use in a graphics processing operation by the graphics processing system. In an embodiment, the graphics processing system is configured to: when generating a render output, process one or more data values using a (respective) floating point representation to generate one or more floating point output data values, for each of one or more, and in an embodiment for each of the one or more output data values, convert the floating point representation of the output data value to an unsigned normalized integer representation U of the output data value in the manner of the technology described herein, and compare the unsigned normalized integer representation U of the output data value with one or more stored unsigned normalized integer data values.

The technology described herein can be implemented in any suitable system, such as a suitably configured microprocessor based system. In an embodiment, the technology described herein is implemented in a computer and/or micro-processor based system.

The various functions of the technology described herein can be carried out in any desired and suitable manner. For example, the functions of the technology described herein can be implemented in hardware or software, as desired. Thus, for example, unless otherwise indicated, the various functional elements and "means" of the technology described herein may comprise a suitable processor or processors, controller or controllers, functional units, circuitry, processing logic, microprocessor arrangements, etc., that are operable to perform the various functions, etc., such as appropriately dedicated hardware elements and/or programmable hardware elements that can be programmed to operate in the desired manner.

It should also be noted here that, as will be appreciated by those skilled in the art, the various functions, etc., of the technology described herein may be duplicated and/or carried out in parallel on a given processor. Equally, the various processing stages may share processing circuitry, etc., if desired.

Furthermore, any one or more or all of the processing stages of the technology described herein may be embodied as processing stage circuitry, e.g., in the form of one or more fixed-function units (hardware) (processing circuitry), and/or in the form of programmable processing circuitry that can be programmed to perform the desired operation. Equally, any one or more of the processing stages and processing stage circuitry of the technology described herein may comprise a separate circuit element to any one or more of the other processing stages or processing stage circuitry, and/or any one or more or all of the processing stages and processing stage circuitry may be at least partially formed of shared processing circuitry.

The data processing system in an embodiment comprises a graphics processing system or graphics processing pipeline. Subject to any hardware necessary to carry out the specific functions discussed above, the graphics processing pipeline can otherwise include any one or more or all of the usual functional units, etc., that graphics processing pipelines include.

It will also be appreciated by those skilled in the art that all of the described embodiments of the technology described herein can, and in an embodiment do, include, as appropriate, any one or more or all of the features described herein.

The methods in accordance with the technology described herein may be implemented at least partially using software e.g. computer programs. It will thus be seen that when viewed from further embodiments the technology described herein comprises computer software specifically adapted to carry out the methods herein described when installed on a data processor, a computer program element comprising computer software code portions for performing the methods herein described when the program element is run on a data processor, and a computer program comprising code adapted to perform all the steps of a method or of the methods herein described when the program is run on a data processing system. The data processor may be a microprocessor system, a programmable FPGA (field programmable gate array), etc.

The technology described herein also extends to a computer software carrier comprising such software which when used to operate a graphics processor, renderer or microprocessor system comprising a data processor causes in conjunction with said data processor said processor, renderer or system to carry out the steps of the methods of the technology described herein. Such a computer software carrier could be a physical storage medium such as a ROM chip, CD ROM, RAM, flash memory, or disk, or could be a signal such as an electronic signal over wires, an optical signal or a radio signal such as to a satellite or the like.

It will further be appreciated that not all steps of the methods of the technology described herein need be carried out by computer software and thus from a further broad embodiment the technology described herein comprises computer software and such software installed on a computer software carrier for carrying out at least one of the steps of the methods set out herein.

The technology described herein may accordingly suitably be embodied as a computer program product for use with a computer system. Such an implementation may comprise a series of computer readable instructions either fixed on a tangible, non-transitory medium, such as a computer readable medium, for example, diskette, CD ROM, ROM, RAM, flash memory, or hard disk. It could also comprise a series of computer readable instructions transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink wrapped software, pre-loaded with a computer system, for example, on a system ROM or fixed disk, or distributed from a server or electronic bulletin board over a network, for example, the Internet or World Wide Web.

Embodiments of the technology described herein will now be described with reference to the figures.

When a computer graphics image is to be displayed, it is usually first defined as a series of primitives (polygons), which primitives are then divided (rasterised) into graphics fragments for graphics rendering in turn. During a normal graphics rendering operation, the renderer will modify the (e.g.) colour (red, green and blue, RGB) and transparency (alpha, a) data associated with each fragment so that the fragments can be displayed correctly. Once the fragments have fully traversed the renderer, then their associated data values are stored in memory, ready for output for display.

Figure 1:
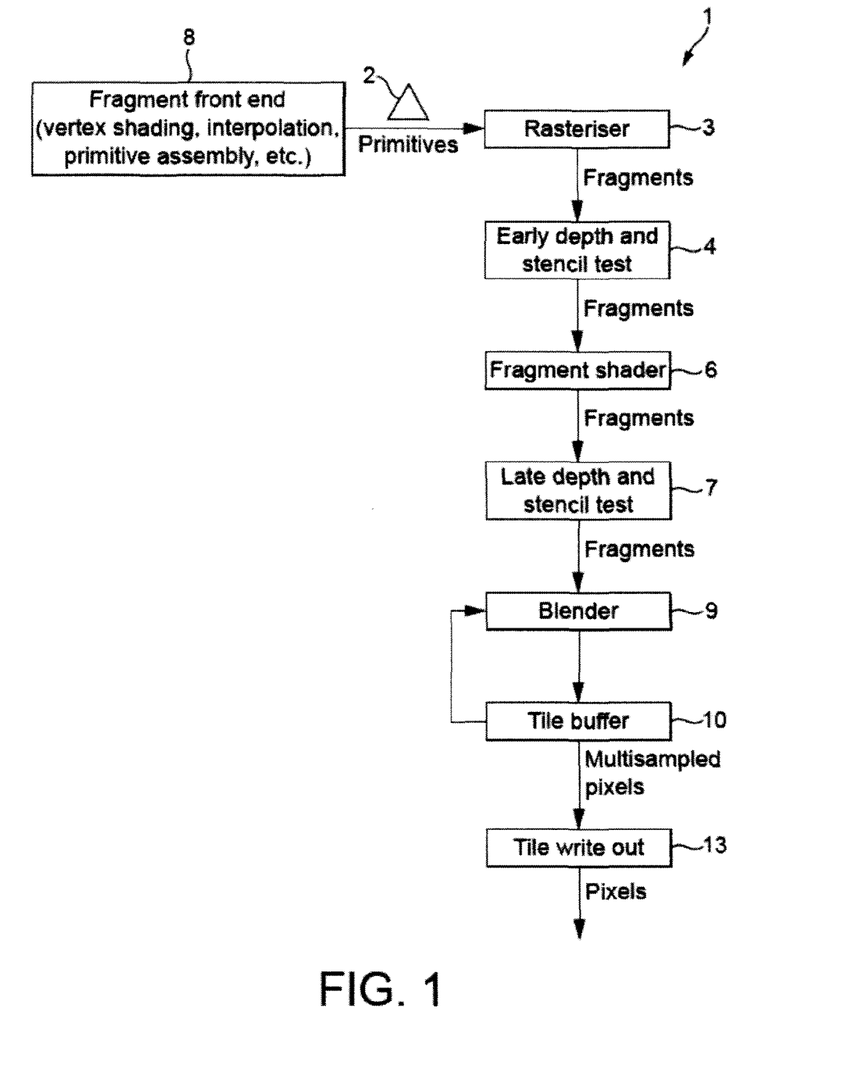
FIG. 1 shows schematically a graphics processing pipeline that can be operated in the manner of the technology described herein.

FIG. 1 shows schematically a graphics processing pipeline 1 that may operate in accordance with the technology described herein. The graphics processing pipeline 1 is a tiled deferred renderer with a fully programmable GPGPU context, for example a renderer which executes partly via Direct Compute, OpenCL, CUDA, etc.

As the graphics processing pipeline 1 shown in FIG. 1 is a tile-based renderer, it will thus produce tiles of a render output data array, such as an output frame to be generated.

(In tile-based rendering, rather than the entire render output, e.g., frame, effectively being processed in one go as in immediate mode rendering, the render output, e.g., frame to be displayed, is divided into a plurality of smaller sub-regions, usually referred to as "tiles". Each tile (sub-region) is rendered separately (typically one-after-another), and the rendered tiles (sub-regions) are then recombined to provide the complete render output, e.g., frame for display. In such arrangements, the render output is typically divided into regularly-sized and shaped sub-regions (tiles) (which are usually, e.g., squares or rectangles), but this is not essential. Each tile corresponds to a respective set of screen space sampling positions.)

The render output data array may typically be an output frame intended for display on a display device, such as a screen or printer, but may also, for example, comprise intermediate data intended for use in later rendering passes (also known as a "render to texture" output), etc.

FIG. 1 shows the main elements and pipeline stages of the graphics processing pipeline 1 that are relevant to the operation of the present embodiment. As will be appreciated by those skilled in the art there may be other elements of the graphics processing pipeline that are not illustrated in FIG. 1. It should also be noted here that FIG. 1 is only schematic, and that, for example, in practice the shown functional units and pipeline stages may share significant hardware circuits, even though they are shown schematically as separate stages in FIG. 1. It will also be appreciated that each of the stages, elements and units, etc., of the graphics processing pipeline as shown in FIG. 1 may be implemented as desired and will accordingly comprise, e.g., appropriate circuitry and/or processing logic, etc., for performing the necessary operation and functions.

FIG. 1 shows schematically the pipeline stages after the graphics primitives (polygons) 2 for input to the rasterisation process have been generated. Thus, at this point the graphics data (the vertex data) has undergone fragment frontend operations 8, such as transformation operations (not shown), vertex shading, interpolation and a primitive set-up stage (not shown) to set-up the primitives to be rendered, in response to the commands and vertex data provided to the graphics processor.

As shown in FIG. 1, this part of the graphics processing pipeline 1 includes a number of stages, including a rasterisation stage 3, an early Z (depth) and stencil test stage 4, a renderer in the form of a fragment shading stage 6, a late Z (depth) and stencil test stage 7, a blending stage 9, a tile buffer 10 and a downsampling and writeout (multisample resolve) stage 13.

The rasterisation stage 3 of the graphics processing pipeline 1 operates to rasterise the primitives making up the render output (e.g. the image to be displayed) into individual graphics fragments for processing. To do this, the rasteriser 3 receives graphics primitives 2 for rendering, rasterises the primitives to sampling points and generates graphics fragments having appropriate positions (representing appropriate sampling positions) for rendering the primitives.

The fragments generated by the rasteriser are then sent onwards to the rest of the pipeline for processing.

The early Z/stencil stage 4 performs a Z (depth) test on fragments it receives from the rasteriser 3, to see if any fragments can be discarded (culled) at this stage. To do this, it compares the depth values of (associated with) fragments issuing from the rasteriser 3 with the depth values of fragments that have already been rendered (these depth values are stored in a depth (Z) buffer that is part of the tile buffer 10) to determine whether the new fragments will be occluded by fragments that have already been rendered (or not). At the same time, an early stencil test is carried out.

Fragments that pass the fragment early Z and stencil test stage 4 are then sent to the fragment shading stage 6. The fragment shading stage 6 performs the appropriate fragment processing operations on the fragments that pass the early Z and stencil tests, so as to process the fragments to generate the appropriate rendered fragment data.

This fragment processing may include any suitable and desired fragment shading processes, such as executing fragment shader programs on the fragments, applying textures to the fragments, applying fogging or other operations to the fragments, etc., to generate the appropriate fragment data. In the present embodiment, the fragment shading stage 6 is in the form of a shader pipeline (a programmable fragment shader), but other arrangements, such as the use also or instead of fixed function fragment shading units would be possible, if desired.

There is then a "late" fragment Z and stencil test stage 7, which carries out, inter alia, an end of pipeline depth test on the shaded fragments to determine whether a rendered fragment will actually be seen in the final image. This depth test uses the Z-buffer value for the fragment's position stored in the Z-buffer in the tile buffers 10 to determine whether the fragment data for the new fragments should replace the fragment data of the fragments that have already been rendered, by comparing the depth values of (associated with) fragments issuing from the fragment shading stage 6 with the depth values of fragments that have already been rendered (as stored in the depth buffer). This late fragment depth and stencil test stage 7 also carries out any necessary "late" alpha and/or stencil tests on the fragments.

The fragments that pass the late fragment test stage 7 are then subjected to, if required, any necessary blending operations with fragments already stored in the tile buffer 10 in the blender 9. Any other remaining operations necessary on the fragments, such as dither, etc. (not shown) are also carried out at this stage.

Finally, the (blended) output fragment data (values) are written to the tile buffer 10 from where they can, for example, be output to a frame buffer for display. The depth value for an output fragment is also written appropriately to a Z-buffer within the tile buffer 10. (The tile buffer will store colour and depth buffers that store appropriate colour, etc., values or a Z-value, respectively, for each sampling position that the buffers represent (in essence for each sampling position of a tile that is being processed).) These buffers store an array of fragment data that represents part (a tile) of the overall render output (e.g. image to be displayed), with respective sets of sample values in the buffers corresponding to respective pixels of the overall render output (e.g. each 2×2 set of sample values may correspond to an output pixel, where 4× multisampling is being used).

The tile buffer is provided as part of RAM that is located on (local to) the graphics processing pipeline (chip).

The data from the tile buffer 10 is input to a downsampling (multisample resolve) write out unit 13, and thence output (written back) to an external memory output buffer, such as a frame buffer of a display device (not shown). (The display device could comprise, e.g., a display comprising an array of pixels, such as a computer monitor or a printer.)

In the present embodiments, the downsampling and writeout unit 13 downsamples (in either a fixed or variable fashion) the fragment data stored in the tile buffer 10 to the appropriate resolution for the output buffer (device) (i.e. such that an array of pixel data corresponding to the pixels of the output device is generated), to generate output values (pixels) for output to the output buffer.

Once a tile of the render output has been processed and its data exported to a main memory (e.g. to a frame buffer in a main memory (not shown)) for storage, the next tile is then processed, and so on, until sufficient tiles have been processed to generate the entire render output (e.g. frame (image) to be displayed). The process is then repeated for the next render output (e.g. frame) and so on.

Other arrangements for the graphics processing pipeline 1 would, of course, be possible.

The above describes certain features of the operation of the graphics processing system shown in FIG. 1. Further features of the operation of the graphics processing system shown in FIG. 1 in accordance with embodiments of the technology described herein will now be described.

In the present embodiment, in the graphics processing pipeline 1, numbers that represent depth values are processed in the graphics processing pipeline 1 using a floating point representation, but when the depth values are written out to and stored in the depth buffer (in the tile buffer 10) (or otherwise stored in memory), they are stored using an unsigned normalized integer ("unorm") representation. Equally, numbers that represent colour values in the graphics processing pipeline 1 are processed in the graphics processing pipeline 1 using a floating point representation, but are stored in the tile buffer 10 or frame buffer in memory using a unorm representation.

Thus, when it is desired to write a depth or colour value to the depth/tile buffer or to memory, the graphics processing pipeline 1 converts the floating point representation of the depth or colour value to a unorm representation of the depth or colour value, and stores the determined unsigned normalized integer representation U of the depth or colour value. Equally, when it is desired to compare or combine, etc., a newly generated floating point depth or colour value with a stored unorm depth or colour value, the graphics processing pipeline 1 converts the floating point representation of the new depth or colour value into a unorm representation of the depth or colour value, and then compares or combines, etc., the new depth or colour value with the stored depth or colour value as appropriate.

Thus, the present embodiment operates to convert a floating point representation of a number x to a corresponding unsigned normalized integer ("unorm") representation U of the number, where the number x may represent a depth value or a colour value (e.g. an RGB or RGBα component) in a graphics processing pipeline 1.

To do this conversion, in the present embodiment, rounding to the nearest integer is used where half integers are rounded up in the conversion. Thus, the value of a b-bit unorm representation U of a number x is given by the equation:

$$U = \text{floor}(x \times (2^b - 1) + 0.5), \quad (1)$$

where the unorm representation U of the number x is clamped according to:

$U = 2^b - 1$ for $x \geq 1.0$, and
$U = 0$ for $x \leq 0$.

It would also be possible to round half integers down, to round half integers to the nearest even integer, or to round half integers to the nearest odd integer, etc. Where half integers are rounded down, the determination of the unsigned normalized integer representation U of the number x may be done according to the equation (or any equivalents thereof):

$$U = \text{floor}(x \times (2^b - 1) + 0.49999 \ldots).$$

Where half integers are rounded to the nearest even or odd integer, the rounding may use the integer part I of $(x \times 2^b)$, to determine whether a half integer should be rounded up or down.

In the present embodiment, the floating point number x is defined in accordance with the IEEE 754 Standard, and so is represented by and stored as plural exponent bits, plural mantissa bits, and a sign bit. The floating point number x may have any precision, such as for example 16-bit (half), 32-bit (single), 64-bit (double), or 128-bit (quad) precision. The floating point representation of the number x should be a normalised floating point representation of the number x. Where the number representation of the number x is not normalised, it should be normalised before being processed.

The unorm representation U will be an integer between 0 and $(2^b - 1)$ that represents the value of the number, where b is the number of bits, i.e. the precision, of the unorm representation U. Values of the number x in the range 0 to 1 are linearly mapped to unorm integers in the range 0 to $(2^b - 1)$, using rounding to the nearest integer. The unorm representation U may have any precision b, such as for example 1-bit, 2-bit, 4-bit, 8-bit, 10-bit, 12-bit, 16-bit, 24-bit or 32-bit precision.

The number x may represent any kind of data, such as depth or "Z" values, or colour (e.g. RGB or RGBα) values, etc. in the graphics processing system.

Figure 2:
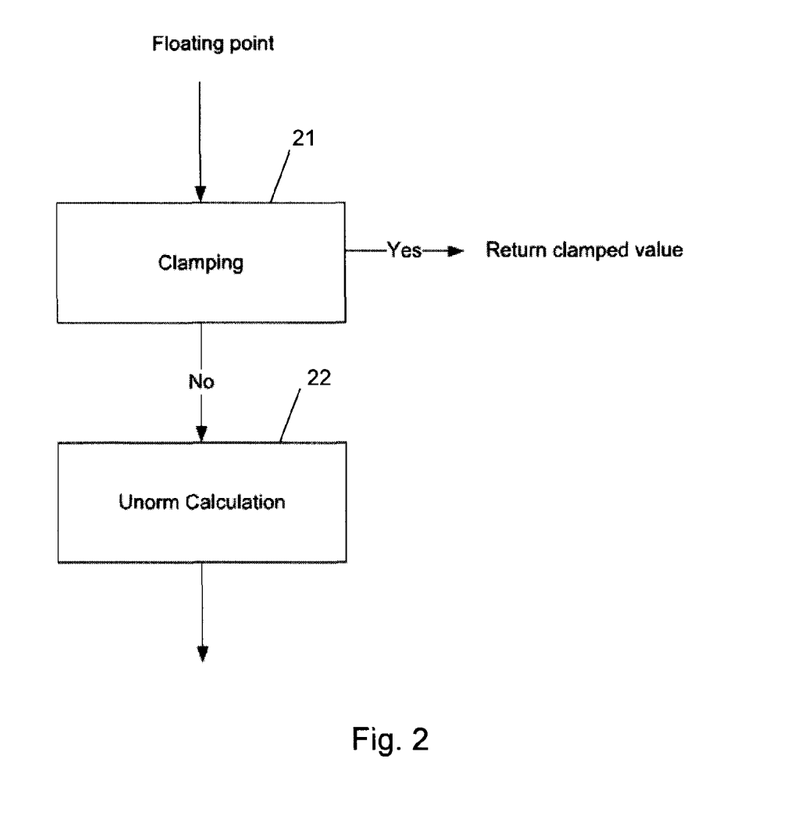
FIG. 2 shows schematically a process in accordance with an embodiment of the technology described herein.

As shown in FIG. 2, in the present embodiment an input floating point representation of a number x to be converted into an unsigned normalized integer representation U is initially subjected to clamping (step 21), e.g. according to the above equations. If the number x is greater than or equal to 1.0, then the unsigned normalized integer representation U of the number is clamped to $(2^b - 1)$. If the number x is less than or equal to 0, then the unsigned normalized integer representation U of the number is clamped to 0.

In the present embodiment whether or not the floating point number x is greater than or equal to 1.0 is determined by considering the exponent of the floating point representation of the number x. If the exponent (with the exponent bias applied where appropriate) is larger than or equal to zero, then the number x will be greater than or equal to 1.0. If the exponent (with the exponent bias applied where appropriate) is less than zero, then the number x will be less than 1.0.

Correspondingly, whether or not the number x is less than or equal to 0 is determined by considering the sign bit of the floating point number x (where present). If the sign bit indicates that the number x is negative, then it is determined that number x is less than zero. If the sign bit indicates that the number x is positive, then it is determined that the number x is greater than or equal to zero.

Other techniques would, of course, be possible.

Where the clamping operation is successful, then the clamped value is returned as the final value for the unsigned normalized integer representation U of the number x. Where clamping operation is unsuccessful, then an appropriate unsigned normalized integer representation U is determined in step 22.

In the present embodiment, the calculation of the unorm representation U is based on the recognition that equation (1) can be rewritten as:

$$U = \text{floor}(x \times 2^b - (x - 0.5)). \quad (2)$$

If the floating point number x has an exponent equal to −1, the value of (x−0.5) can be determined by setting the most significant bit ("MSB") of the binary representation of the number x to zero. This is because for decimal values of the number x between 0 and 1, the number x will be greater than or equal to 0.5 (and less than 1) where the exponent is equal to −1, since in this case the most significant bit of the mantissa of the binary representation of the number x will represent the value 0.5 (i.e. the value $2^{-1}$). Setting the most significant bit to zero in this case will have the effect of subtracting 0.5 from the number x. (Note that the implicit bit, which may be absent from the stored mantissa (according to the IEEE 754 Standard) should be prepended to the mantissa before it is used, as appropriate.)

If the exponent is less than −1, then the number x will be less than 0.5, and the bit that represents 0.5 will be zero. In this case, the binary representation of the value (x−0.5) can be determined by subtracting 0.5 from the mantissa shifted by a bias, where the bias corresponds to the exponent plus 1 and is positive, i.e. by determining:

$$(\text{mantissa} \gg \text{bias}) - 0.5$$

This assumes that no bits are lost in the shift, which can be assured e.g. by appending enough zeros on both operands. (If the exponent is greater than or equal to zero, then the unorm representation U of the number x is clamped as discussed above.)

The subtraction can be performed by determining the two's complement of 0.5, and then adding this to the mantissa shifted by the bias. The two's complement operation is determined according to:

$$X = \sim Y + 1$$

Table 1 shows some examples of the two's complement of 0.5.

TABLE 1

| 0.5 | Two's complement |
|---|---|
| 'b0001 | 'b1_1111 |
| 'b0010 | 'b1_1110 |
| 'b0100 | 'b1_1100 |
| 'b1000 | 'b1_1000 |

It can be seen from Table 1 that the two's complement of 0.5 consists of a sequence of bits set to one, that may be followed by one or more values of zero. For x<0.5, the bits of the binary representation of the number x that represent the value 0.5 and higher will be set to zero, while the bits of the two's complement of 0.5 (the value −0.5) that represent values less than 0.5 will be set to zero. Accordingly, the subtraction of 0.5 can be done by ORing (merging) the two's complement of 0.5 with the shifted mantissa.

Figure 3:
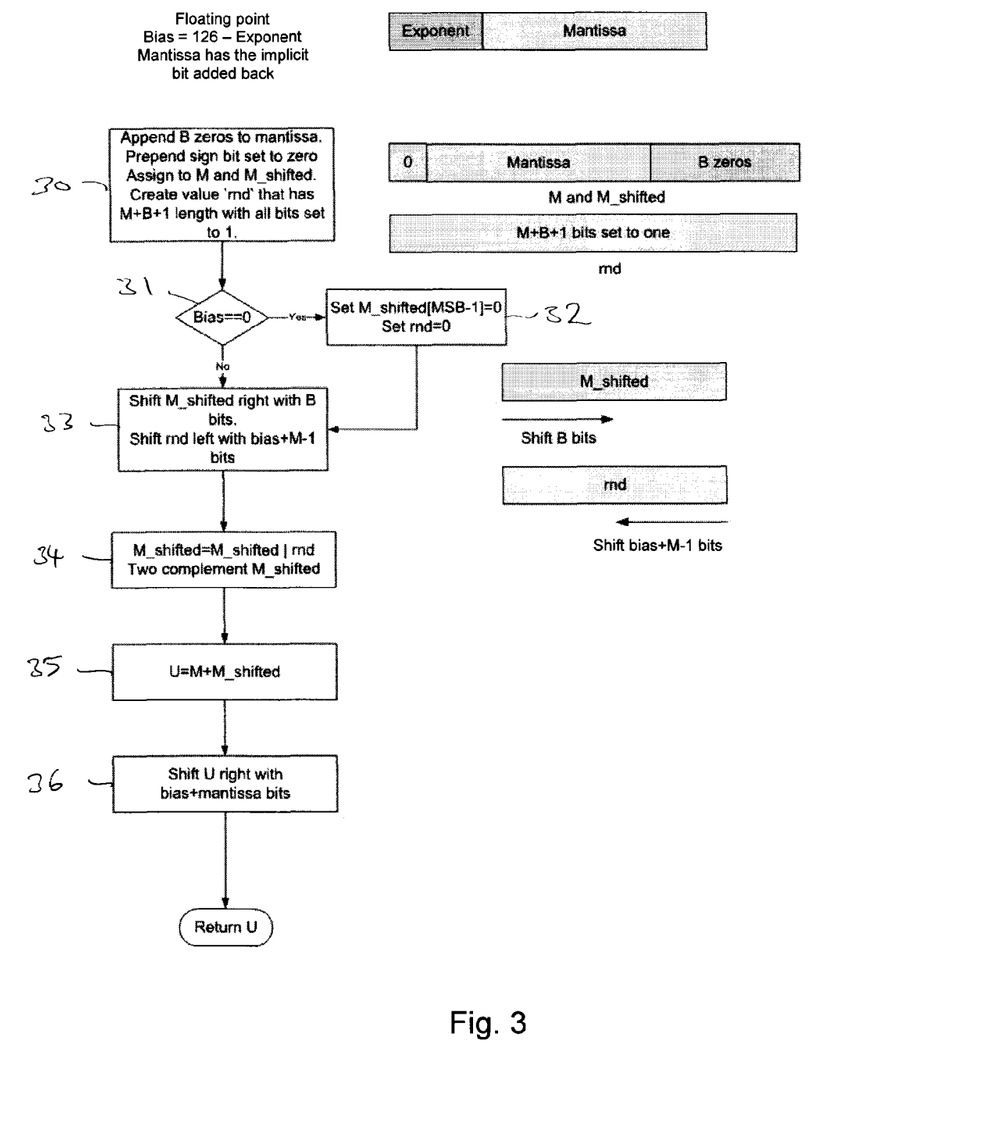
FIG. 3 shows schematically a process in accordance with an embodiment of the technology described herein.

FIG. 3 illustrates an embodiment of the technology described herein.

As shown in FIG. 3, in step 30 the implicit bit is added to the binary representation of the mantissa of the floating point representation of the number x, a sign bit set to zero is prepended, and b zeros are appended to the binary representation of the mantissa of the floating point representation of the number x (which the implicit bit added back and the sign bit set to zero), i.e. so as to determine a shifted version of the binary representation of the value of $(x \times 2^b)$. This value is assigned to values "M" and "M_shifted".

A binary number ("rnd") is created that comprises a sequence of bits which are all set to 1, having a length equal to the number of bits (the precision) M of the mantissa of the floating point representation of the number x, plus the precision b of the unorm number, plus 1 (i.e. M+b+1). As will be appreciated, this value corresponds to a shifted version of the two's complement of 0.5.

In the present embodiment, it is determined whether the number x is greater than or equal to 0.5 by considering the exponent of the floating point representation of the number x (step 31). Where the exponent of the floating point representation of the number is equal to −1 (i.e. where the bias is equal to zero), then it is determined that this is the case. Otherwise, it is determined that the number x is less than 0.5. The exponent to be used in the present embodiment is determined from the stored exponent in the floating point representation of the number x by applying the appropriate exponent bias. Where the exponent bias is equal to 127, the bias is determined by subtracting the stored exponent from 126.

If it is determined that the bias is equal to zero, then the most significant bit of the value M_shifted is set to zero (step 32). As discussed above, and as will be appreciated by those having skill in the art, this will have the effect of determining a shifted version of the value (x−0.5). In this case, the value "rnd" is then set to zero.

Following this, and/or if it is determined that the bias is not equal to zero (so that the number x is less than 0.5), then the value "rnd" is shifted to the left by a number of bits corresponding to the bias, plus the number of bits M of the mantissa of the floating point representation of the number x, minus 1 (step 33). The value M_shifted is also shifted to the right by b bits.

The value M_shifted is then merged with the value "rnd" by ORing these values together (step 34). As discussed above, and as will be appreciated by those having skill in the art, this will have the effect of determining a shifted version of the value (x−0.5) where the number x is less than 0.5 or will have no effect where the number x is greater than or equal to 0.5 (since in this case rnd will have been set to zero).

The two's complement of the resulting value is then determined. As discussed above, and as will be appreciated by those having skill in the art, this will have the effect of determining the value (0.5−x) or a shifted version of the value (0.5−x).

The resulting value is then added to the value M (step 35). As discussed above, and as will be appreciated by those having skill in the art, this will have the effect of determining the value $((x \times 2^b)-(x-0.5))$ or a shifted version of the value $((x \times 2^b)-(x-0.5))$.

Finally, the unorm representation of the number x is determined by shifting the resulting value to the right by a number of bits corresponding to the bias plus the number of bits (the precision) M of the mantissa of the floating point representation of the number x (step 36). As discussed above, and as will be appreciated by those having skill in the art, this will have the effect of determining the largest integer not greater than $((x \times 2^b)-(x-0.5))$ (i.e. floor$((x \times 2^b)-(x-0.5))$), and therefore the unsigned normalized integer representation U of the number x.

As will be appreciated by those of skill in the art, this means that the unorm conversion can be done by one or more shift operations, one or more addition operations, and one or more two's complement operations. The Applicants have found that this represents a particularly efficient method for converting from a floating point number to an unsigned normalized integer number, e.g. in terms of the required on-chip area and/or the amount of processing required, and therefore the power consumption.

A number of example operations will now be described in order to illustrate various embodiments of the technology described herein.

The following examples describe the conversion of various floating point representations of a number to the corresponding 4-bit unorm representation of the number. The floating point representations include a sign bit, an exponent and a mantissa. The exponent uses an exponent bias of 127, i.e. so that the "true" exponent may be determined by subtracting the stored exponent from 127. The mantissa is stored absent the implicit bit (i.e. in accordance with the IEEE 754 Standard).

Negative number
 sign=1
 exponent=Any
 mantissa=Any

In this case, the unorm representation of the number is clamped to zero since the number is negative. This can be determined by examining the sign bit of the floating point representation of the number which is indicative of a negative number.

Number larger than one
 sign=0
 exponent=larger than 126
 mantissa=Any

In this case, the unorm representation of the number will be clamped to 1 since the number is larger than or equal to 1. This can be determined by examining the exponent of the floating point representation of the number which indicates that the number is larger than or equal to one.

x=0.75
 sign=0
 exponent=126
 mantissa=0x400000

In this case, according to equation (1) above, the unorm representation of the number 0.75 should be:

$$\text{flooor}(0.75*15+0.5)=\text{floor}(11.75)=11$$

The first step is to calculate the bias and to append back the implicit one to the mantissa:
 bias=126−126=0
 mantissa=0xc0_0000

The value $A=(x \times 2^b)$ is then determined by appending b zeros to the mantissa, which in this case will be 4 zeros since the conversion is to a 4-bit unorm representation:
 A=0xc00_0000

The values M and M_shifted are then assigned to A. All bits of the value "rnd" are also set to 1.

M=0xc00_0000
M_shifted=0xc00_0000
rnd=0x1fff_ffff
bias=0

The next step is to merge the rounded value into M_shifted. In this case, the bias is zero, so it is known that M_shifted is higher than 0.5 and that the most significant bit (MSB-1) bit is set to 1. Therefore, in this case, the merge or rounding can be done by subtracting 0.5 from M_shifted by setting M_shifted[MSB-1] to zero.

In this case, the value "rnd" is set to zero since the subtraction was done by setting MSB to zero.
M_shifted=0x400_0000
rnd=0

Next, the merging is done by shifting rnd and M_shifted and ORing them together:
M_shifted=0x400_0000>>B=0x400_0000>>4=0x40_0000
rnd=0
M_shifted=M_shifted 1 rnd=0x40_0000

Next, the two's complement of M_shifted is determined:
M_shifted=0x1fc0_0001

Note that the two's complement is done using M+b+1 bits. This is why the top bits are set (sign extension). The next step is to add M to M_shifted:
U=0xc00_0000+0x1fc0_0001=0x2bc0_0001

The resulting value is then stripped of the sign bit and above. Note that if the result is negative the result will be zero after the bias shift.
U=0xbc0_0001>>M+B=0xbc0_0001>>24+4=0xb
The result is 0xb=11.
x=0.24609375
sign=0
exponent=124
mantissa=0x7c0000

In this case, according to equation (1) above, the unorm representation of the number 0.24609375 should be:

floor(0.24609375*15+0.5)=floor(4.19)=4

The first step is to calculate the bias and to append back the implicit one to the mantissa:
bias=126−124=2
mantissa=0xfc_0000

The value $A=(x \times 2^b)$ is then determined by appending b zeros to the mantissa, which in this case will be 4 zeros since the conversion is to a 4-bit unorm representation:
A=0xfc0_0000

The values M and M_shifted are then assigned to A. All bits of the value "rnd" are also set to 1.
M=0xfc0_0000
M_shifted=0xfc0_0000
rnd=0x1fff_ffff
bias=2

The next step is to merge the rounded value into M_shifted. In this case, the bias is not zero. Therefore, the merging of the rounding is done by ORing the value "rnd" with M_shifted. To do this, the "rnd" value should only have bits set where M_shifted is zero.

So, the merging is done by shifting rnd and M_shifted and ORing them together:
M_shifted=0xfc0_0000>>B=0xfc00_0000>>4=0xfc_0000
rnd=rnd<<24+2−1=0x1700_0000
M_shifted=M_shifted 1 rnd=0x17fc_0000

Next, the two's complement of M_shifted is determined:
M_shifted=~0x17fc_0000+1=0x103_ffff+1=0x104_0000

Note that the two's complement is done using M+b+1 bits. This is why the top bits are set (sign extension). The next step is to add M to M_shifted:
U=0xfc0_0000+0x104_0000=0x10c4_0000

The resulting value is then stripped of the sign bit and above. Note that if the result is negative the result will be zero after the bias shift.
U=0x10c4_0000>>M=0xc4_0000>>24+2=0x4
The result is 0x4=4.

As can be seen from the above, the technology described herein, in its embodiments at least, provides a simple and effective technique for determining an unsigned normalized integer representation U of a number x that has a value between 0 and 1.

This is achieved, in embodiments of the technology described herein at least, by determining whether the number x is greater than or equal to 0.5, and then inverting (clearing) the bit of the binary representation of the number x that represents the value 0.5 if it is determined that the number x is greater than or equal to 0.5.

The foregoing detailed description has been presented for the purposes of illustration and description. It is not intended to be exhaustive or to limit the technology to the precise form disclosed. Many modifications and variations are possible in the light of the above teaching. The described embodiments were chosen in order to best explain the principles of the technology and its practical application, to thereby enable others skilled in the art to best utilise the technology in various embodiments and with various modifications as are suited to the particular use contemplated. It is intended that the scope be defined by the claims appended hereto.

What is claimed is:

1. A method of operating a graphics processing system, comprising:
    when generating a render output the graphics processing system:
    processing a colour or depth data value using a floating point representation to generate a floating point output colour or depth data value, the colour or depth data value comprising a number x; and
    converting the floating point representation of the output colour or depth data value to an unsigned normalized integer representation U of the output colour or depth data value by:
        when the number x has a value between 0 and 1 the graphics processing system:
        determining whether the number x is greater than or equal to 0.5;
        wherein when it is determined by the graphics processing system that the number x is greater than or equal to 0.5, the method further comprises the graphics processing system:
        inverting the bit of the binary representation of the number x that represents the value 0.5; and
        determining the unsigned normalized integer representation U of the number x using the value of the binary representation of the number x having its bit that represents the value 0.5 inverted;
    the graphics processing system comparing the unsigned normalized integer representation U of the output colour or depth data value with one or more stored unsigned normalized integer colour or depth data values and/or storing the unsigned normalized integer representation U of the output colour or depth data value; and
    the graphics processing system using the unsigned normalized integer representation U of the output colour or depth data value to generate an image for display and providing the image to a display.

2. The method of claim 1, wherein when it is determined that the number x is other than greater than or equal to 0.5, the method further comprises:
determining a binary representation of the value (x−0.5) by merging a binary representation of the negative of 0.5 with a binary representation of the number x; and
determining the unsigned normalized integer representation U of the number x using the binary representation of the value (x−0.5).

3. The method of claim 2, wherein merging a binary representation of the negative of 0.5 with a binary representation of the number x comprises performing an OR operation between the binary representation of the negative of 0.5 and the binary representation of the number x.

4. The method of claim 3, further comprising determining the binary representation of the negative of 0.5 by shifting a predetermined binary number.

5. The method of claim 1, further comprising:
when the number x has a value that is greater than or equal to 1, clamping the unsigned normalized integer representation U of the number x to a first predefined value; and
when the number x has a value that is less than or equal to 0, clamping the unsigned normalized integer representation U of the number x to a second predefined value.

6. The method of claim 1, wherein determining whether the number x is greater than or equal to 0.5 and/or less than 0.5 comprises determining whether the exponent of the floating point representation of the number x is equal to −1.

7. The method of claim 1, comprising:
using one or more shift operations, one or more addition operations, and one or more two's complement operations to determine the unsigned normalized integer representation U of the number x.

8. A method of operating a graphics processing system, comprising:
when generating a render output the graphics processing system:
processing a colour or depth data value using a floating point representation to generate a floating point output colour or depth data value, the colour or depth data value comprising a number x; and
converting the floating point representation of the output colour or depth data value to an unsigned normalized integer representation U of the colour or depth output data value by:
when the number x has a value between 0 and 1 the graphics processing system:
determining whether the number x is less than 0.5;
wherein when it is determined by the graphics processing system that the number x is less than 0.5, the method further comprises the graphics processing system:
determining a binary representation of the value (x−0.5) by merging a binary representation of the negative of 0.5 with a binary representation of the number x; and
determining the unsigned normalized integer representation U of the number x using the binary representation of the value (x−0.5);
the graphics processing system comparing the unsigned normalized integer representation U of the output colour or depth data value with one or more stored unsigned normalized integer colour or depth data values and/or storing the unsigned normalized integer representation U of the output data value; and
the graphics processing system using the unsigned normalized integer representation U of the output colour or depth data value to generate an image for display and providing the image to a display.

9. A graphics processing system, comprising apparatus for determining an unsigned normalized integer representation U of a number x that has a value between 0 and 1, comprising:
processing circuitry configured to determine whether the number x is greater than or equal to 0.5; and
processing circuitry configured to, when it is determined that the number x is greater than or equal to 0.5:
invert the bit of the binary representation of the number x that represents the value 0.5; and
determine the unsigned normalized integer representation U of the number x using the value of the binary representation of the number x having its bit that represents the value 0.5 inverted;
wherein the graphics processing system is configured to:
when generating a render output:
process one or more colour or depth data values using a floating point representation to generate one or more floating point output colour or depth data values;
convert the floating point representations of the one or more output colour or depth data values to respective unsigned normalized integer representations U of the one or more output colour or depth data values;
compare the unsigned normalized integer representations U of the one or more output colour or depth data values with one or more stored unsigned normalized integer colour or depth data values and/or store the unsigned normalized integer representations U of the one or more output colour or depth data values; and
use the unsigned normalized integer representation U of the output colour or depth data value to generate an image for display and provide the image to a display.

10. The graphics processing system of claim 9, further comprising:
processing circuitry configured to, when it is determined that the number x is other than greater than or equal to 0.5:
determine a binary representation of the value (x−0.5) by merging a binary representation of the negative of 0.5 with a binary representation of the number x; and
determine the unsigned normalized integer representation U of the number x using the binary representation of the value (x−0.5).

11. The graphics processing system of claim 10, further comprising:
processing circuitry configured to merge the binary representation of the negative of 0.5 with the binary representation of the number x by performing an OR operation between the binary representation of the negative of 0.5 and the binary representation of the number x.

12. The graphics processing system of claim 11, further comprising:
processing circuitry configured to determine the binary representation of the negative of 0.5 by shifting a predetermined binary number.

13. A graphics processing system, comprising apparatus for determining an unsigned normalized integer representation U of a number x that has a value between 0 and 1, comprising:
processing circuitry configured to determine whether the number x is less than 0.5; and processing circuitry configured to, when it is determined that the number x is less than 0.5:
   determine a binary representation of the value (x−0.5) by merging a binary representation of the negative of 0.5 with a binary representation of the number x; and
   determine the unsigned normalized integer representation U of the number x using the binary representation of the value (x−0.5);
wherein the graphics processing system is configured to: when generating a render output:
   process one or more colour or depth data values using a floating point representation to generate one or more floating point output colour or depth data values;
   convert the floating point representations of the one or more output colour or depth data values to respective unsigned normalized integer representations U of the one or more output colour or depth data values;
   compare the unsigned normalized integer representations U of the one or more output colour or depth data values with one or more stored unsigned normalized integer colour or depth data values and/or store the unsigned normalized integer representations U of the one or more output colour or depth data values; and
   use the unsigned normalized integer representation U of the output colour or depth data value to generate an image for display and provide the image to a display.

14. The graphics processing system of claim 9, further comprising:
   processing circuitry configured to determine whether the number x is greater than or equal to 0.5 and/or less than 0.5 comprises determining whether the exponent of the floating point representation of the number x is equal to −1.

15. The graphics processing system of claim 9, wherein the apparatus is configured to:
   clamp the unsigned normalized integer representation U of the number x to a first predefined value when determining a b-bit unsigned normalized integer representation U of a number x that is greater than or equal to 1; and
   clamp the unsigned normalized integer representation U of the number x to a second predefined value when determining a b-bit unsigned normalized integer representation U of a number x that is less than or equal to 0.

16. The graphics processing system of claim 9, comprising:
   processing circuitry operable to perform a shift operation;
   processing circuitry operable to perform an addition operation; and
   processing circuitry operable to perform a two's complement operation;
   wherein the processing circuitry is configured to determine the unsigned normalized integer representation U of the number x.

17. A non-transitory computer readable storage medium storing computer software code which when executing on a processor performs a method of operating a graphics processing system, the method comprising:
   when generating a render output:
   processing a colour or depth data value using a floating point representation to generate a floating point output colour or depth data value, the colour or depth data value comprising a number x; and
   converting the floating point representation of the output colour or depth data value to an unsigned normalized integer representation U of the output colour or depth data value by:
      when the number x has a value between 0 and 1:
      determining whether the number x is greater than or equal to 0.5;
      wherein when it is determined that the number x is greater than or equal to 0.5, the method further comprises:
         inverting the bit of the binary representation of the number x that represents the value 0.5; and
         determining the unsigned normalized integer representation U of the number x using the value of the binary representation of the number x having its bit that represents the value 0.5 inverted;
   the method further comprising comparing the unsigned normalized integer representation U of the output colour or depth data value with one or more stored unsigned normalized integer colour or depth data values and/or storing the unsigned normalized integer representation U of the output colour or depth data value; and
   using the unsigned normalized integer representation U of the output colour or depth data value to generate an image for display and providing the image to a display.

* * * * *